(12) United States Patent
Saya et al.

(10) Patent No.: US 9,437,807 B2
(45) Date of Patent: Sep. 6, 2016

(54) PIEZOELECTRIC COMPOSITION AND PIEZOELECTRIC ELEMENT

(71) Applicant: TDK CORPORATION, Tokyo (JP)

(72) Inventors: Yuko Saya, Tokyo (JP); Taku Masai, Tokyo (JP); Masahito Furukawa, Tokyo (JP); Masamitsu Haemori, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/674,466

(22) Filed: Mar. 31, 2015

(65) Prior Publication Data

US 2015/0280105 A1 Oct. 1, 2015

(30) Foreign Application Priority Data

Mar. 31, 2014 (JP) .................. 2014-072245
Feb. 13, 2015 (JP) .................. 2015-026222

(51) Int. Cl.
| | |
|---|---|
| *H01L 41/187* | (2006.01) |
| *C04B 35/475* | (2006.01) |
| *H01L 41/083* | (2006.01) |
| *H01L 41/08* | (2006.01) |

(52) U.S. Cl.
CPC ......... *H01L 41/1878* (2013.01); *C04B 35/475* (2013.01); *H01L 41/083* (2013.01); *H01L 41/0805* (2013.01)

(58) Field of Classification Search
CPC .......................... C04B 35/462; C04B 35/475
USPC ....... 310/358; 257/347; 252/62.9 R, 62.9 PZ
See application file for complete search history.

(56) References Cited

U.S. PATENT DOCUMENTS

| | | | | |
|---|---|---|---|---|
| 6,798,119 | B2 * | 9/2004 | Ikeda ............... | G11B 5/5552 310/321 |
| 2003/0234595 | A1 * | 12/2003 | Takahashi .......... | B41J 2/14233 310/324 |
| 2010/0208007 | A1 * | 8/2010 | Nihei ............... | B41J 2/14233 347/68 |
| 2010/0232043 | A1 * | 9/2010 | Hishinuma ........ | G02B 26/0858 359/824 |
| 2011/0007115 | A1 * | 1/2011 | Kobayashi .......... | B41J 2/14233 347/68 |
| 2011/0254899 | A1 * | 10/2011 | Sakai ............... | B41J 2/14032 347/68 |
| 2011/0254901 | A1 * | 10/2011 | Sakai ............... | B41J 2/14233 347/71 |
| 2012/0187325 | A1 | 7/2012 | Hoffmann et al. | |
| 2013/0153812 | A1 * | 6/2013 | Jeon ................ | C04B 35/475 252/62.9 PZ |
| 2013/0250011 | A1 * | 9/2013 | Sakai ............... | B41J 2/14233 347/71 |
| 2014/0292160 | A1 * | 10/2014 | Kubota ............. | H01L 41/0477 310/366 |
| 2015/0221858 | A1 * | 8/2015 | Masai .............. | H01L 41/1878 310/311 |
| 2015/0270475 | A1 * | 9/2015 | Isshiki ............. | H01L 41/18 310/360 |

FOREIGN PATENT DOCUMENTS

JP 2013-500919 A 1/2013

* cited by examiner

*Primary Examiner* — J. San Martin

(74) *Attorney, Agent, or Firm* — Oliff PLC

(57) ABSTRACT

The present invention aims to provide a piezoelectric composition and a piezoelectric element containing the piezoelectric composition. In the piezoelectric composition, the main component contains a substance represented by the following formula with a perovskite structure,

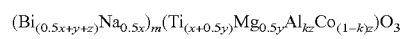

$0.15 \leq x \leq 0.7$, $0.28 \leq y \leq 0.75$, $0.02 \leq z \leq 0.30$, $0.17 \leq k \leq 0.83$, $0.75 \leq m \leq 1.0$, and $x+y+z=1$.

2 Claims, 2 Drawing Sheets

PIEZOELECTRIC COMPOSITION AND PIEZOELECTRIC ELEMENT

The present invention relates to a piezoelectric composition and a piezoelectric element widely used in fields such as a piezoelectric sounder, a piezoelectric sensor, a piezoelectric actuator, a piezoelectric transformer or a piezoelectric ultrasonic motor or the like.

BACKGROUND

A piezoelectric element with a piezoelectric composition used therein has an effect of generating a deformation when an external electric field is applied, and also has an effect of generating electric charges on the surface when it receives an external stress. Recently, such a piezoelectric element is widely used in various fields.

For example, a piezoelectric element which uses a piezoelectric composition such as lead zirconate titanate (Ph(Zr, Ti)$O_3$:PZT) and the like will deform in proportion to the applied electric voltage with the displacement value being in a level of about $1 \times 10^{-10}$ m/V. Thus, such a piezoelectric element is excellent in fine position adjustment and can be further used for fine adjustment m an optical system.

Besides, as a piezoelectric composition will generate electric charges in proportion to the applied stress or the deformation caused by the stress, it also can be employed as a sensor for detecting minute forces or the extent of deformations.

Furthermore, a piezoelectric composition has an excellent responsiveness. Thus, when an alternating current field is applied, resonance could occur due to the excitation of the piezoelectric composition itself or an elastic body coupled with the piezoelectric composition. In this respect, a piezoelectric composition can also be used as a piezoelectric transformer, a ultrasonic motor and etc.

Most of these piezoelectric compositions have a perovskite structure. The piezoelectric composition is formed by applying a polarization treatment to a ferroelectric composition. The polarization treatment is such a operation that a high direct current electric field is applied to a isotropic ferroelectric ceramics obtained after firing so as to render the direction of the ferroelectric domain to be consistent in a certain direction, and thus the ferroelectric composition is provided with a polarity. Since the perovskite structure with the spontaneous polarization capable of being three dimensionally oriented is quite helpful, most piezoelectric compositions in practical use have the perovskite structure.

Currently, most of the piezoelectric compositions in practical use are (PZT-based) solid solutions composed of PbZr$O_3$(PZ)-PbTi$O_3$(PT). The piezoelectric compositions meeting various needs can be widely developed by adding various accessory ingredients or additives into the PZT-based piezoelectric composition.

There are different piezoelectric compositions such as a piezoelectric composition with a low mechanical quality factor (Qm) and a high piezoelectric constant (d), and a piezoelectric composition with a low piezoelectric constant (d) and a high mechanical quality factor (Qm). The previous one is used in an actuator or the like for position adjustment which seeks a large displacement via a direct current based usage. The latter one is applicable to alternating current related uses. For example, the latter one is used in an ultrasonic generating element such as an ultrasonic motor.

In addition, there are substances other than PZT-based ones that can be used as piezoelectric compositions, most of which are solid solutions using a lead based perovskite component such as lead magnesio-niobate (Pb(Mg,Nb)$O_3$: PMN) or the like as the main component.

However, these lead based piezoelectric compositions contain 60 to 70 mass % of lead oxides with a low melting point which is likely to volatilize during, the firing process. If the influence on the environment is considered, it is expected that less lead oxides will be used.

Therefore, the lead-free piezoelectric composition will become an extremely important issue if the piezoelectric ceramics and the piezoelectric single-crystals are to be applied to more fields and to be used in more amounts.

As a lead-free piezoelectric composition, for example, barium titanate (BaTi$O_3$), the bismuth layered ferroelectric or the like are well known. However, since the barium titanate has a curie point as low as 120° C. and its piezoelectric property will disappear at a temperature higher than 120° C., it will not be practical if it is bonded by welding or used in vehicles. On the other hand, although the bismuth layered ferroelectric usually has a curie point of 400° C. or higher and is excellent in thermal stability, its crystal anisotropy is high. Thus, it is necessary to use a method, such as a hot forging method, in which spontaneous polarization is oriented by applying shear stress while heating and sintering the bismuth layered ferroelectric. Hence, problems arise in the aspect of productivity.

Recently, the bismuth sodium titanate based composition is being studied as a new piezoelectric composition. For instance, Patent Document 1 has disclosed a piezoelectric ceramic composition containing bismuth sodium titanate.

The piezoelectric ceramic composition in Patent Document 1 contains a matrix material and the matrix material contains at least two matrix components with a perovskite structure. Alternatively, the piezoelectric ceramic composition is only composed of the matrix component. Further, a piezoelectric ceramic composition is disclosed in which a first matrix component is selected from the group consisting of (Bi$_{0.5}$A$_{0.5}$)E$O_3$ and BaE$O_3$ and the other matrix component is Bi(Me$_{0.5}$E$_{0.5}$)$O_3$, wherein A represents an alkali metal and is especially selected from the group consisting of sodium, potassium and a mixture of alkali metals, E is independently selected from titanium, zirconium and their mixture, and Me is selected from the group consisting of bivalent metals.

PATENT DOCUMENT

Patent Document 1: JP-A-2013-500919

SUMMARY

However, the piezoelectric composition disclosed in Patent Document 1 is not provided with sufficient piezoelectric properties compared to the lead based piezoelectric composition. The piezoelectric properties are desired to be further improved especially because the spontaneous polarization is quite low.

Further, a technical problem arise that a high insulating property cannot be achieved in the case of the Bi(Me$_{0.5}$E$_{0.5}$)$O_3$ based material. When such material is prepared as an actuator element, most of the current will flow into the material when this element is being driven, resulting in a technical problem that power consumption in this electrical circuit increases. In order to solve such a technical problem, the material must have a high resistivity.

In this respect, the present invention has studied the composition range with which piezoelectric properties and resistivity can be increased. In addition, the present invention aims to prepare a lead-free compound so as to provide an excellent piezoelectric composition and an excellent piezoelectric element even from the viewpoint of low pollution, environment-friendliness and ecology.

In order to solve the above mentioned technical problems, the present inventors have used some bismuth sodium titanate based compositions to test the piezoelectric composition showing good piezoelectric properties, and have found a piezoelectric composition which is different from the conventional ones in the composition range.

The piezoelectric composition is characterized in that the main component contains a substance represented by the following formula with a perovskite structure.

$$(Bi_{(0.5x+y+z)}Na_{0.5x})_m(Ti_{x+0.5y}Mg_{0.5y}Al_{kz}Co_{(1-k)z})O_3$$

$0.15 \leq x \leq 0.7,$ $0.28 \leq y \leq 0.75,$ $0.02 \leq z \leq 0.30,$ $0.17 \leq k \leq 0.83,$ $0.75 \leq m \leq 1.0,$ wherein, $x+y+z=1$, With the ranges mentioned above, the piezoelectric properties will be improved, and especially the ratio of the residual polarization to the spontaneous polarization will be increased. Further, the electric resistivity also can be increased.

Besides, a piezoelectric element using the piezoelectric composition mentioned above can be provided such as a piezoelectric element used in an ink jet printer head, a piezoelectric actuator or a film sensor in which the displacement of the actuator is quite large or the sensitivity of the sensor is quite high. Furthermore, as a high resistivity can be provided, the power consumption in the driving circuit can be inhibited when such a piezoelectric element works as an actuator one.

As mentioned above, the piezoelectric composition according to the present invention has a high spontaneous polarization and also a high resistivity. Besides, as no lead is used, this piezoelectric composition is extremely excellent even if low pollution, environment-friendliness and ecology are considered. Further, this material can provide excellent piezoelectric properties.

DETAILED DESCRIPTION OF EMBODIMENTS

Figure 1:
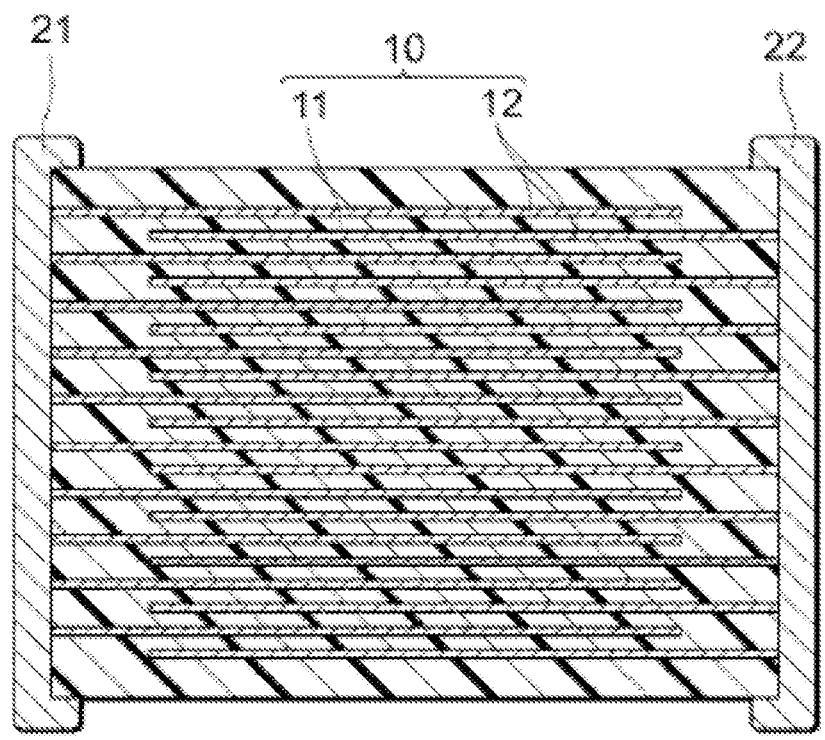
FIG. 1 is a schematic drawing showing the cross-section of a laminated piezoelectric element.

Hereinafter, the embodiments of the present invention will be described in detail.

The piezoelectric composition of the first embodiment in the present invention is characterized in that the main component contains a substance represented by the following formula with a perovskite structure.

$$(Bi_{(0.5x+y+z)}Na_{0.5x})_m(Ti_{x+0.5y}Mg_{0.5y}Al_{kz}Co_{(1-k)z})O_3 \quad (A)$$

$0.15 \leq x \leq 0.7,$ $0.28 \leq y \leq 0.75,$ $0.02 \leq z \leq 0.30,$ $0.17 \leq k \leq 0.83,$ $0.75 \leq m \leq 1.0,$ wherein, $x+y+z=1$, The range of x is preferably $0.15 \leq x \leq 0.7$. When x is less than 0.15, it is hard to form the perovskite structure. On the other hand, it is impossible to get sufficient piezoelectric properties when x is higher than 0.7. More preferably, x ranges from 0.15 to 0.35 so that even better piezoelectric properties will be provided.

Furthermore, the range of y is preferred to be $0.28 \leq y \leq 0.75$. When y is less than 0.2.8 it is impossible to obtain sufficient piezoelectric properties. On the other hand, when y is higher than 0.75, the piezoelectric properties will deteriorate accompanied with generation of heterogeneous phase, or the electric resistivity will decrease. More preferably, y ranges from 0.35 to 0.75 so that better piezoelectric properties will exhibit.

Besides, the range of z is preferably $0.02 \leq z \leq 0.3$. When z is less than 0.02, it is not likely to provide sufficient piezoelectric properties. When z becomes larger than 0.3, the piezoelectric properties will deteriorate accompanied with generation of heterogeneous phases with structures other than the perovskite one. And, z is more preferably $0.1 \leq z \leq 0.3$ so that better piezoelectric properties will be shown.

Furthermore, the range of k is preferably $0.17 \leq k \leq 0.83$. When k is lower than 0.17, the resistivity will decrease. When k is higher than 0.83, it is not likely to provide sufficient piezoelectric properties. More preferably, k ranges from 0.17 to 0.5 so that higher piezoelectric properties will be obtained. Further, k is made to range from 0.33 to 0.5 so that a higher resistivity can be achieved.

In the formula mentioned above, the range of m is preferably $0.75 \leq z \leq 1.0$. The m represents the constituent ratio of atoms at A site to atoms at B site (i.e., the ratio of A to B) in the compound with a perovskite structure inside the entire piezoelectric composition. In the case of stoichiometric composition, m will be 1.0. However, the composition may also deviate from the stoichiometric one. When in is higher than 1, the grain growth will be slowed down with the increase of the sintering temperature so that it is not likely to provide high piezoelectric properties. On the other hand, if m is 1 or less, sinterability can be improved and higher piezoelectric properties can be obtained. However, if in is less than 0.75, crystalline phases other than the perovskite phase will generate, which will make the piezoelectric properties worse. Thus, m is preferred to be within the range of 0.75 or more and 1.0 or less. Moreover, when in is less than 0.75, the resistivity may reduce due to the generation of the heterogeneous phases.

The piezoelectric composition of the present embodiment contains bismuth sodium titanate as a first compound, the bismuth-magnesium-titanium composite oxides as a second compound, and a mixture of bismuth aluminate and bismuth cobaltate as a third compound. These three components are deemed as the main component.

In other words, the piezoelectric composition contains the first compound, the second compound and the third compound. These three compounds are prepared as a solid solution. Alternatively, they also can be a partial solid solution.

The formula (A) can be represented by the following formula if the chemical formulae of the first, the second and the third compounds are used.

The piezoelectric composition is characterized in that it can be represented by the following formula.

$$(Bi_{0.5}Na_{0.5})_{s1}TiO_3 - yBi_{t1}(Mg_{0.5}Ti_{0.5})O_3 - z(Bi_{u1}Al_kCo_{1-k})O_3 \quad (1)$$

$0.15 \leq x \leq 0.7$, $0.28 \leq y \leq 0.75$, $0.02 \leq z \leq 0.30$, $0.17 \leq k \leq 0.83$, wherein, $x+y+z=1$, and $s1$, $t1$ and $u1$ are all 0.75 or more and 1.0 or less.

The bismuth sodium titanate can be listed as the first compound of above mentioned formula 1. The composition of bismuth sodium titanate is represented by the following formula 2, wherein sodium and bismuth are located, at the A site of the perovskite structure, and titanium is located at the B site of the perovskite structure.

$$(Bi_{0.5}Na_{0.5})_{s1}TiO_3 \quad (2)$$

In the above mentioned formula 2 of the first compound, s1 represents the constituent ratio derived from the molar ratio of the elements at A site to those at B site (hereinafter referred to as the ratio of A to B). In the case of stoichiometric composition, s1 is preferred to be 1.0. However, the composition may also deviate from the stoichiometric one. If s1 is 1.0 or less, the sinterability will be improved and better piezoelectric properties will be provided. Beside, s1 is more preferably 0.75 or more and 1.0 or less because better piezoelectric properties can be obtained. The constituent amounts of sodium, bismuth and oxygen are calculated according to the stoichiometric composition. However, they can also deviate from the stoichiometric composition.

As the second compound of the above mentioned formula 1, the bismuth-magnesium-titanium composite oxides can be listed. The composition of the bismuth-magnesium-titanium composite oxides is represented by the following formula 3, wherein bismuth is located at A site of the perovskite structure, and magnesium and titanium are located at B site of the perovskite structure.

$$Bi_{t1}(Mg_{0.5}Ti_{0.5})O_3 \quad (3)$$

In the above mentioned formula 3, t1 represents the ratio of A to B. If the composition follows a stoichiometric one, t1 is preferred to be 1.0. However, the composition can also deviate from the stoichiometric one. If t1 is 1.0 or less, the sinterability will be improved and better piezoelectric properties will be obtained. Furthermore, t1 is more preferably 0.75 or more and 1.0 or less for better piezoelectric properties can be obtained. The constituent amounts of magnesium, bismuth and oxygen are calculated according, to the stoichiometric composition. However, they can also deviate from the stoichiometric composition.

As the third compound, bismuth aluminate, bismuth cobaltate and their mixture can be listed. The composition of this compound can be represented by the following formula 4, wherein bismuth is located at A site a the perovskite structure, and aluminum or cobalt is located at B site of the perovskite structure.

$$Bi_{u1}Al_kCo_{1-k}O_3 \quad (4)$$

In formula 4 mentioned above, u1 represents the ratio of A to B. If the composition follows a stoichiometric one, u1 is preferred to be 1.0. However, the composition can also deviate from the stoichiometric composition. If u1 is 1.0 or less, the sinterability can be improved and better piezoelectric properties can be obtained. Besides, u1 is more preferably 0.75 or more and 1.0 or less because better piezoelectric properties are obtainable. The constituent amounts of aluminum, cobalt, bismuth and oxygen are calculated according to the stoichiometric composition. However, they can also deviate from the stoichiometric composition.

With respect to the mentioned s1, t1 and u1, as $xs1+yt1+zu1=m$, the requirement of $0.75 \leq m \leq 1.0$ can be satisfied.

The mentioned $(Bi_{0.5}Na_{0.5})_{s1}TiO_3$ has a rhombohedral perovskite structure. $Bi_{t1}(Mg_{0.5}Ti_{0.5})O_3$ has an orthorhombic perovskite structure, and $Bi_{u1}AlO_3$ and $Bi_{u1}CoO_3$ both have a tetragonal perovskite structure. Therefore, similar to the PZT based piezoelectric composition, the piezoelectric composition of the present embodiment has a structure close to the crystallographic phase boundary (morphotropic phase boundary) so that excellent piezoelectric properties can be obtained.

Further, the mentioned $(Bi_{0.5}Na_{0.5})_{s1}TiO_3$ is ferroelectric and it becomes a relaxor ferroelectric by forming a solid solution together with $Bi_{t1}(Mg_{0.5}Ti_{0.5})O_3$. However, when it is a relaxor material, no domain structure is present and only the unstable polarization called the polar-nano-region exists. Thus, the domain with a submicron size can be stably formed if a solid solution is formed by using the mixture of $Bi_{u1}AlO_3$, $Bi_{u1}CoO_3$ or the mixed material $Bi_{u1}Al_kCo_{1-k}O_3$ which are all ferroelectrics. Besides, $Bi_{u1}AlO_3$, $Bi_{u1}CoO_3$ and the mixed material $Bi_{u1}Al_kCo_{1-k}O_3$ are characterized in that the ratio of the length of c axis to that of a axis (c/a, hereinafter referred to as tetragonality) in the tetragonal perovskite structure is high. Hence, if such material is subjected to the solution treatment, the travel distance of the ions becomes larger when an electric field is applied. As a result, a large piezoelectric displacement can be obtained.

Further, as $BiCoO_3$ has a higher tetragonality than $BiAlO_3$, $BiCoO_3$ will be more helpful to the improvement of the piezoelectric properties. However, it is easy to be both bivalent and trivalent for the valence number of Co, so the resistivity is very low. Therefore, when $BiCoO_3$ is mixed with $BiAlO_3$ having the same crystal structure and a high insulativity in which Al can only be trivalent, a high insulativity can be provided, and a piezoelectric displacement can be provided as high as possible.

In the present embodiment, besides the elements constituting the first, the second and the third compounds, impurities or constituent elements of other compounds can be contained in the amounts of about several tens to several hundreds of ppm. As such elements, for example, Ba (barium), Sr (strontium), Ca (calcium) Li (lithium), Zr (zirconium) Hf (hafnium), Nb (niobium), Zn (zinc), Ni (nickel), Ta (tantalum), Si (silicon), B (boron) and rare earth elements can be listed.

In addition, the piezoelectric composition of the present embodiment may contain lead as the impurity. The content of lead is preferably 1 mass % or less. More preferably, no lead is contained, it is preferred from the viewpoint of low pollution, environment-friendliness and ecology because the volatilization of lead in the sintering process and the discharge of the lead into the environment after it is distributed in the market as a piezoelectric component and then abandoned can be inhibited to be a minimum.

Further, the piezoelectric composition of the present invention preferably col tprises a compound as the accessory component and this compound contains at lease one element selected from the group consisting of Mn, Fe and Cu. The total amount of the accessory component is preferably 0.04 to 0.6 mass % based on the whole main components if the calculation is performed based on elements.

The piezoelectric composition with such a composition can be prepared as follows.

First of all, powders of bismuth oxide, sodium carbonate, titanium oxide, iron oxide, alumina, magnesium carbonate and the like are prepared as the starting materials in accordance with needs. After sufficiently dried at a temperature of 100° C. or higher, these powders are weighted based on the target composition. In addition, with respect to the starting materials, substances such as carbonates or oxalates which will turn to oxides via a firing process can be used to replace the oxides, and also oxides or other substances which will turn to oxides by firing can be used instead of the carbonates.

Next, the weighted starting materials are sufficiently mixed for 5 hours to 20 hours in an organic solvent or water by using an instrument such as a ball mill. Thereafter, the mixture is sufficiently dried, subjected to a press molding, and then calcined at a temperature of 750° C. to 900° C. for about 1 hour to 3 hours. Then, the calcined substance is pulverized in an organic solvent or water by a ball mill for 5 hours to 30 hours. The resultant materials are dried again and subjected to a granulation process with the addition of a binder solution. Then, a press molding process is provided to the powders obtained from the granulation process so that the powders are produced into blocks.

After produced into blocks, the molded body is subjected to a thermal treatment at a temperature of 400° C. to 800° C. for about 2 hours to 4 hours so that the binder is removed. Then, a sintering process is performed at a temperature of 950° C. to 1300° C. for about 2 hours to $ hours.

The heating rate and cooling rate in the sintering process are both, for example, about 50° C./hour to 300° C./hour. After the sintering process, the obtained sintered body is polished according to needs and electrodes are disposed. Thereafter, a polarization treatment is provided in a silicone oil of 25° C. to 150° C. by applying an electric field of 5 MV/m to 10 MV/m for about 5 minutes to 1 hour. Thus, the piezoelectric composition mentioned above can be obtained.

The average particle diameter of the grains in the piezoelectric composition obtained is the method described above is about 0.5 µm to 20 µm.

FIG. 1 shows a structure example of the laminated piezoelectric element using the piezoelectric composition according to the present embodiment. This piezoelectric element has a laminated body 10 in which multiple internal electrodes 12 and multiple piezoelectric layers 11 composed of the piezoelectric composition of the present embodiment are alternatively laminated. Each piezoelectric layer ii has a preferable thickness of, for example, about 1 µm to 100 µm. The number of the piezoelectric layers 11 to be laminated may be determined in accordance with the target displacement value.

For example, such a piezoelectric element can be prepared as follows. Firstly, after calcined powders are prepared by using the same method as that for the piezoelectric composition described, above, vehicles are added. They are mixed to prepare the paste for the piezoelectric layer.

Then, in order to form the internal electrodes 12, the conductive material and the vehicles are mixed. Alternatively, various oxides or organo-metallic compounds which will turn to conductive materials after a firing process are mixed with the vehicles. In this way, the paste for the internal electrodes is prepared. The conductive material is not particularly limited. For example, the conductive material is preferably at least one selected from the group consisting of silver (Ag), gold (Au), platinum (Pt), copper (Cu), nickel (Ni) and palladium (Pd), or the alloy thereof in addition, besides these mentioned ones, the internal electrode 12 may further contain various trace components such as phosphorus (P) in an amount of about 0.1 wt % or less. The thickness of the internal electrode 12 is preferred to be, for example, about 0.5 µm to 3 µm.

In addition, additives such as a dispersing agent, a plasticizer, a dielectric material, an insulating material or the like can be added into the paste for the internal electrode if needed.

The paste for the piezoelectric layer and the paste for the internal electrode obtained by the steps mentioned above are used to prepare a green chip as the precursor of the laminated body 10 through, for example, a print method or a sheet method.

After a debindering process is applied to the green chip which is prepared by the steps mentioned above, the green chip is sintered to form the lam mated body 10.

The end surfaces in the laminated body 10 obtained by the steps mentioned above are polished by barrel-polishing or sandblasting. The paste for the terminal electrodes which is prepared by a same process with that of the paste for the internal electrodes is printed or gravure-printed, and then fired. Thus, the terminal electrodes 21 and 22 are formed. The paste for the terminal electrodes contains, for example, a conductive material, a glass hit and a vehicle. The conductive material contains at least one selected from the group consisting of Ag, Au, Cu, Ni, Pd and Pt. The vehicle is an organic vehicle or an aqueous vehicle, wherein the organic vehicle is one obtained by dissolving a binder in an organic solvent, and the aqueous vehicle is one obtained by dissolving a water-soluble binder and a dispersing agent in water. In this way, the piezoelectric laminated element shown in FIG. 1 is obtained.

The preparation method described above is called as the solid-phase reaction method. A vapor phase growth method can be listed as a representative method other than the one mentioned above.

The vapor phase growth method is a process in which the starting material (i.e., target material) is vaporized iinder vacuum to form a film with a thickness of about several tens of nanometers to several microns on a smooth substrate. The vapor phase growth method can be sputtering, evaporation, pulsed laser deposition and the like. With these methods, a dense film can be formed in an atomic level and segregation will hardly occur. In the vapor phase growth method, the starting material (target material) is physically vaporized and then deposited on the substrate. The excitation source varies depending on the film-forming method. When the sputtering method is used, Ar plasma becomes the excitation source. When the method in use is the evaporation method, an electron beam becomes the excitation source. If the pulsed laser deposition is used, the laser will be the excitation source and will irradiate the target.

As described above, there are several methods for film deposition of the piezoelectric film M the vapor phase growth. As a representative example, the pulsed laser deposition method will be described.

In a vacuum chamber, the substrate for film deposition is heated at a temperature of 500° C. to 800° C. The substrate is heated while the vacuum degree is kept at a high vacuum condition with a pressure of $1 \times 10^{-3}$ to $1 \times 10^{-5}$ Pa so that the cleanliness of the surface will be improved.

During the film deposition process, the laser irradiates the target material. The evaporation of the target material due to the radiation of the laser will make the film deposited on the substrate.

The parameters other than the temperature of the substrate are power of the laser, the concentration degree of the laser, the distance between the substrate and the target and the like. The desired properties will be obtained by controlling these parameters.

In addition, in order to supplement oxygen during the film deposition of oxides, the oxygen gas is circulated preferably under an oxygen pressure of $1\times10^{-1}$ to $1\times10^{-5}$ Pa. If a higher oxygen pressure is used, the rate of film deposition will decrease.

The target material Which is used as the starting material for the film deposition can be a sintered body prepared by the solid-phase reaction method. When such a vapor phase growth method is used, the piezoelectric composition of the present invention is usually formed on the Si substrate or the MgO substrate or the $SrTiO_3$ substrate or the like. If the piezoelectric composition is deposited on the Si substrate, the Pt lower electrode is deposited as a film after a film of the adhesion layer of Ti or Cr or the like is deposited.

As the method for yielding a polycrystalline film there is a method in which the substrate is heated while the crystal grows at the same time. In another method, the polycrystalline film is obtained by depositing a film at normal temperature and then sintering at a desired temperature. When the film deposition is carried out at normal temperature, the desired crystalline phases can be obtained by depositing the piezoelectric Material and then appropriately applying, a post-annealing treatment.

The piezoelectric composition of the present invention can be utilized in, for example, a piezoelectric sounder, an ultrasonic sensor, a piezoelectric actuator, a piezoelectric transformer, a film sensor, a film actuator or a piezoelectric ultrasonic motor. In addition, the piezoelectric composition can be applied to other elements as long as the piezoelectric composition can be used in these elements.

EXAMPLES

Hereinafter, the present invention will be further described in detail based on the examples and the comparative examples. However, the present invention is not limited to the following examples.

Example 1 to Example 13

Figure 2:
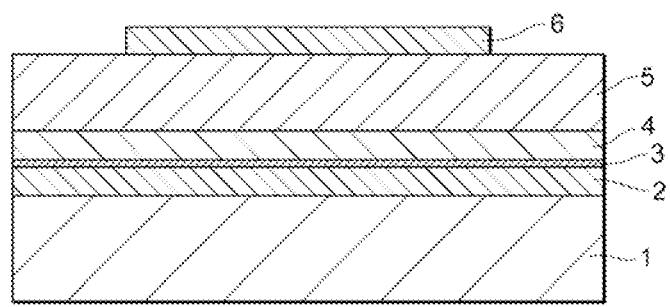
FIG. 2 is a schematic drawing showing the cross-section of a piezoelectric film element.

FIG. 2 was a cross-section view showing the structure of the piezoelectric film element in the examples. With respect to the substrate, a Si substrate 1, to which a thermal oxide film was attached, was used. The Si substrate 1 was a round substrate with a diameter of 3 inches, and it was composed of the Si substrate 1 with a (100) plane orientation and a thickness of 0.5 mm and a thermal oxide film 2 with a thickness of 500 nm formed thereon. First of all, a Ti adhesion layer 3 and a lower electrode layer 4 were deposited on the substrate by a RF magnetron sputtering method. The lower electrode layer 4 was composed of the Ti adhesion layer 3 and the Pt lower electrode layer 4 deposited thereon. And, the Ti adhesion layer 3 had a thickness of 20 nm and was formed on the thermal oxide film 2, and the Pt lower electrode layer 4 had a thickness of 200 nm and was preferably oriented to a (111) plane. The thickness of the Ti adhesion layer 3 could be properly adjusted as long as the layer could function as an adhesion layer.

The film deposition condition for the Ti adhesion layer 3 and the Pt lower electrode layer 4 was that the temperature of the substrate was room temperature, the discharge power was 100W, the introduced gas was Ar, and the pressure for film deposition was 0.3 Pa.

Thereafter, a piezoelectric film 5 was deposited on the Pt lower electrode layer 4. The pulsed laser deposition method (hereinafter referred to as PLD) was used as the film deposition method. The piezoelectric film 5 had a thickness of 500 nm. As the targets for PLD, the targets of $(Bi_{0.5}Na_{0.5})TiO_3$, $Bi(Mg_{0.5}Ti_{0.5})O_3$, $Bi_2O_3$, $Al_2O_3$ and $Co_3O_4$ were used. The rate of film deposition was respectively 0.02 nm/shot, 0.03 nm/shot, 0.1 nm/shot, 0.02 nm/shot and 0.004 nm/shot. The composition ratios shown in Table 1 were obtained by adjusting the number of shots. The condition for film deposition was as follows. Specifically, the temperature of the substrate was normal temperature, the power of the laser was 50 mJ, $O_2$ was introduced and the pressure was $1.33\times10^{-3}$ Pa. After the film was deposited, a thermal treatment was carried out for 1 minute at 800° C. in oxygen atmosphere. With these processes, piezoelectric films of the examples were obtained.

In order to evaluate the electrical properties of the piezoelectric film 5, Pt with a thickness of 100 nm was deposited on the upper surface of the piezoelectric film 5 by the RF magnetron sputtering method. The film deposition condition was the same as that for the lower electrode. Then, a pattern was formed by photolithography and etching and etc. to provide an upper electrode 6. Thereby, a piezoelectric film element for the evaluation of electrical properties was prepared.

The spontaneous polarization $[C/m^2]$ was measured to evaluate the piezoelectric properties. The spontaneous polarization was calculated from the product of the piezoelectric constant $[C/N]$ and the stress $[N/m^2]$, so it was a method to maximize the spontaneous polarization so as to get a high piezoelectric constant. The spontaneous polarization was measured by using the Sawyer-Tower circuit. The spontaneous polarization was tested while an alternating current field of −50 MV/m to +50 MV/m was applied. Further, the maximal value Pm of polarization was measured as well as the residual polarization Pr. The ratio of Pr to Pm was compared to perform the evaluation on the piezoelectric properties. At that time, the input frequency of the circuit was 1 kHz.

The resistivity was measured by using Advantest R8340 Digital Ultra-High Resistance/Micro Current Meter when a voltage of 10 MV/m was applied.

Comparative Examples 1 to 11

In Comparative Examples 1 to 11, the targets of $(Bi_{0.5}Na_{0.5})TiO_3$, $Bi(Mg_{0.5}Ti_{0.5})O_3$, $Bi_2O_3$, $Al_2O_3$ and $Co_3O_4$ were combined as in Examples while the constituent ratios were changed in accordance with Table 1 so as to prepare the piezoelectric film elements by using the same method as that in Examples.

The results about the ratio of Pm and Pr and the resistivity R were shown in Table 1, wherein Pm represented the maximal value of spontaneous polarization and Pr represented the residual polarization. The symbol ⊚ was labeled where the value of Pr/Pm was 0.20 or more and the resistivity R was 1.0E+12 (Ω·cm), and the symbol Δ was given where the value of Pr/Pm was less than 0.2 and the resistivity R was 1.0E+12 (Ω·cm) or more. In addition, the symbol x was provided where the resistivity R was less than 1.0E+10 (Ω·cm) and where the piezoelectric properties could not be evaluated.

TABLE 1

| | $(Bi_{0.5}Na_{0.5})TiO_3$ x | $Bi(Mg_{0.5}Ti_{0.5})O_3$ y | $BiAlO_3$ + $BiCoO_3$ z | $BiAlO_3/z$ k | $BiAlO_3$ | $BiCoO_3$ | Resistivity R ($\Omega \cdot cm$) | Ratio of Pr to Pm | Judgment |
|---|---|---|---|---|---|---|---|---|---|
| Example 1 | 0.15 | 0.75 | 0.1 | 0.5 | 0.05 | 0.05 | $8.9 \times 10^{14}$ | 0.42 | ⊚ |
| Example 2 | 0.3 | 0.5 | 0.2 | 0.5 | 0.1 | 0.1 | $2.5 \times 10^{15}$ | 0.33 | ⊚ |
| Example 3 | 0.35 | 0.35 | 0.3 | 0.5 | 0.15 | 0.15 | $4.1 \times 10^{15}$ | 0.33 | ⊚ |
| Example 4 | 0.35 | 0.35 | 0.3 | 0.83 | 0.25 | 0.05 | $6.4 \times 10^{14}$ | 0.25 | ⊚ |
| Example 5 | 0.4 | 0.4 | 0.2 | 0.5 | 0.1 | 0.1 | $4.1 \times 10^{14}$ | 0.29 | ⊚ |
| Example 6 | 0.45 | 0.45 | 0.1 | 0.5 | 0.05 | 0.05 | $3.9 \times 10^{14}$ | 0.24 | ⊚ |
| Example 7 | 0.35 | 0.35 | 0.3 | 0.33 | 0.1 | 0.2 | $8.8 \times 10^{13}$ | 0.35 | ⊚ |
| Example 8 | 0.35 | 0.35 | 0.3 | 0.17 | 0.05 | 0.25 | $3.7 \times 10^{13}$ | 0.41 | ⊚ |
| Example 9 | 0.7 | 0.28 | 0.02 | 0.5 | 0.01 | 0.01 | $2.5 \times 10^{12}$ | 0.22 | ⊚ |
| Comparative Example 1 | 0.97 | 0.01 | 0.02 | 0.5 | 0.01 | 0.01 | $6.4 \times 10^{13}$ | 0.11 | Δ |
| Comparative Example 2 | 0.29 | 0.01 | 0.7 | 0.5 | 0.35 | 0.35 | $1.1 \times 10^{16}$ | 0.13 | Δ |
| Comparative Example 3 | 0.45 | 0.25 | 0.3 | 0.5 | 0.15 | 0.15 | $3.4 \times 10^{15}$ | 0.16 | Δ |
| Comparative Example 4 | 0.3 | 0.3 | 0.4 | 0.98 | 0.39 | 0.01 | $2.8 \times 10^{15}$ | 0.13 | Δ |
| Comparative Example 5 | 0.3 | 0.3 | 0.4 | 0.5 | 0.2 | 0.2 | $4.3 \times 10^{14}$ | 0.16 | Δ |
| Comparative Example 6 | 0.5 | 0.5 | 0 | | 0 | — | $3.4 \times 10^{15}$ | 0.13 | Δ |
| Comparative Example 7 | 0.35 | 0.35 | 0.3 | 0.03 | 0.01 | 0.29 | $1.4 \times 10^{9}$ | | X |
| Comparative Example 8 | 0.01 | 0.97 | 0.02 | 0.5 | 0.01 | 0.01 | $8.4 \times 10^{8}$ | | X |
| Comparative Example 9 | 0.1 | 0.8 | 0.1 | 0.5 | 0.05 | 0.05 | $3.6 \times 10^{9}$ | | X |
| Comparative Example 10 | 0.1 | 0.7 | 0.2 | 0.5 | 0.1 | 0.1 | $3.4 \times 10^{8}$ | | X |
| Comparative Example 11 | 0.2 | 0.4 | 0.4 | 0.5 | 0.2 | 0.2 | $3.4 \times 10^{9}$ | | X |
| Comparative Example 12 | 0.25 | 0.15 | 0.6 | 0.5 | 0.3 | 0.3 | $3.4 \times 10^{9}$ | | X |

As shown in Table 1, when the range of the constituent ratio x of $(Bi_{0.5}Na_{0.5})TiO_3$ was $0.15 \leq x \leq 0.7$, the range of the constituent ratio y of $Bi(Mg_{0.5}Ti_{0.5})O_3$ was $0.28 \leq y \leq 0.75$, the range of the constituent ratio z of $BiAlO_3$ or $BiCoO_3$ was $0.02 \leq z \leq 0.30$ and $x+y+z=1$ was satisfied, the ratio of the residual polarization Pr to the maximal value Pm of spontaneous polarization was 2.0 times or more of that in Comparative Example 1. Further, when the range of the constituent ratio x was the range of the constituent ratio y of $Bi(Mg_{0.5}Ti_{0.5})O_3$ was $0.35 \leq y \leq 0.75$, the range of the constituent ratio z of $BiAlO_3$ or $BiCoO_3$ was $0.10 \leq z \leq 0.30$ and $x+y+z=1$ was satisfied, the ratio of Pr to Pm was 3.0 times or more of that in Comparative Example 1.

As described above, if the piezoelectric film element contained bismuth sodium titanate as the first compound, the bismuth-magnesium-titanium composite oxides as the second compound and bismuth aluminate as the third compound, the piezoelectric properties could be improved. Alternatively, the piezoelectric properties also could be improved if the solid solution of the mentioned compounds as contained.

Further, when the range of the constituent ratio k was to be studied, Comparative Example 7 was compared with Example 8 and Example 4. When z was 0.3, Comparative Example 7 in which 1% of $BiAlO_3$ was contained, was compared to the condition where short circuit occurred. The resistivity in Example 8 was sharply increased to $3.7 \times 10^{13}$ [$\Omega \cdot cm$], and the resistivity in Example 4 was further elevated to $6.4 \times 10^{14}$ [$\Omega \cdot cm$].

Besides, if the k values in Example 8 and Example 7 were compared, it could be seen that a higher resistivity was provided in Example 7 where k was 0.5 when compared to Example 8 in which k was 0.17.

However, the ratio of Pr to Pm became larger in Example 8 when compared to Example 4 where only $BiAlO_3$ was present, so it could be confirmed that the addition of $BiCoO_3$ generated an effect of improving the piezoelectric properties.

As shown in these mentioned examples, in case of $(Bi_{(0.5x+y+z)}Na_{0.5x})_m(Ti_{x+0.5y}Mg_{0.5y}Al_{kz}Co_{(1-k)z})O_3$ with $0.15 \leq x \leq 0.7$, $0.28 \leq y \leq 0.75$, $0.02 \leq z \leq 0.30$, $0.17 \leq k \leq 0.83$ and $075 \leq m \leq 1.0$, a kind of material could be obtained having piezoelectric properties with Pr/Pm>0.2 or even better and a resistivity of 1.0E+12 ($\Omega \cdot cm$) or more.

More preferably, in case of $(Bi_{(0.5x+y+z)}Na_{0.5x})_m(Ti_{x+0.5y}Mg_{0.5y}Al_{kz}Co_{(1-k)z})O_3$ with $0.15 \leq x \leq 0.35$, $0.35 \leq y \leq 0.75$, $0.1 \leq z \leq 0.30$, $0.17 \leq k \leq 0.5$ and $0.75 \leq m \leq 1.0$, a kind of material can be obtained having piezoelectric properties with Pr/Pm>0.3 or even better and a resistivity of 1.0E+12 ($\Omega \cdot cm$) or higher.

More preferably, in case of $(Bi_{(0.5x+y+z)}Na_{0.5x})_m(Ti_{x+0.5y}Mg_{0.5y}Al_{kz}Co_{(1-k)z})O_3$ with $0.15 \leq x \leq 0.35$, $0.35 \leq y \leq 0.75$, $0.1 \leq z \leq 0.30$, $0.33 \leq k \leq 0.5$ and $0.75 \leq m \leq 1.0$, a kind of material can be obtained having piezoelectric properties with Pr/Pm>0.3 or even better and a resistivity of 5.0E+13 ($\Omega \cdot cm$) or higher.

Examples 10 to 13 and Comparative Examples 12 to 13

Further, when the range of in was studied, the compositions shown in Table 2 were investigated. In Examples 10 to 13 and Comparative Examples 12 to 13, the ratio of A to B was changed (i.e., the value of m). The target of $(Bi_{0.5}Na_{0.5})_mTiO_3$ and the target of $Bi(Mg_{0.5}Ti_{0.5})_mO_3$ were prepared respectively, and the target with the element ratio of Bi to Al being m:1 was prepared. Then, the piezoelectric film elements were prepared by using the same method as that in Examples.

TABLE 21

| | Constituent ratio x of $Bi_{0.5}Na_{0.5}TiO_3$ | Constituent ratio y of $BiMg_{0.5}Ti_{0.5}O_3$ | Constituent ratio z of $Bi(Al_kCo_{(1-k)})O_3$ | m | Resistivity R ($\Omega \cdot cm$) | Ratio of Pr to Pm |
|---|---|---|---|---|---|---|
| Example 10 | 0.15 | 0.75 | 0.1 | 1.00 | $8.9 \times 10^{14}$ | 0.42 |
| Example 11 | 0.15 | 0.75 | 0.1 | 0.95 | $5.4 \times 10^{14}$ | 0.41 |
| Example 12 | 0.15 | 0.75 | 0.1 | 0.85 | $8.7 \times 10^{13}$ | 0.35 |
| Example 13 | 0.15 | 0.75 | 0.1 | 0.75 | $3.2 \times 10^{13}$ | 0.33 |
| Comparative Example 12 | 0.15 | 0.75 | 0.1 | 0.65 | $2.1 \times 10^{13}$ | 0.11 |
| Comparative Example 13 | 0.15 | 0.75 | 0.1 | 1.05 | $3.0 \times 10^{15}$ | 0.12 |

As shown in Table 2, when in was smaller than 0.75, the resistivity R became smaller and the maximal value Pm of spontaneous polarization also became smaller. On the other hand, when m was larger than 1.0, the maximal value Pm of spontaneous polarization also became smaller.

As a film deposition method for the piezoelectric film, the PLD method had been described. However, any one of the sputtering method, the solution method and the CVD (chemical vapor deposition) method could also be used.

Further, it had been confirmed that the same effect could be achieved even if the piezoelectric element which utilized the piezoelectric composition was prepared by the solid-phase reaction method.

The present invention has been described by providing the embodiments and examples above, but the present invention is not limited thereto. In the embodiments and examples described above, only the cases in which the first and the second compounds are contained have been described. However, other compounds also can be contained therein.

The piezoelectric composition of the present invention can be widely utilized in the fields of the actuator, the sensor or the resonator.

DESCRIPTION OF REFERENCE NUMERALS

1 Si substrate
2 Thermal oxide film
3 Ti adhesion layer
4 Lower electrode
5 Piezoelectric film
6 Upper electrode
10 Laminated body
11 Piezoelectric layer
12 Interior electrode layer
21 Electrode terminal
22 Electrode terminal

What is claimed is:

1. A piezoelectric composition comprising a main component which contains a substance represented by the following formula with a perovskite structure,

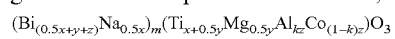

wherein, $0.15 \leq x \leq 0.7$, $0.28 \leq y \leq 0.75$, $0.02 \leq z \leq 0.30$, $0.17 \leq k \leq 0.83$, $0.75 \leq m \leq 1.0$, and $x+y+z=1$.

2. A piezoelectric element comprising said piezoelectric composition of claim 1 and electrodes for applying a voltage.

* * * * *